United States Patent [19]
Aprille, Jr.

[11] 3,972,002
[45] July 27, 1976

[54] DUAL FEEDBACK AMPLIFIER
[75] Inventor: Thomas Joseph Aprille, Jr., Andover, Mass.
[73] Assignee: Bell Telephone Laboratories, Incorporated, Murray Hill, N.J.
[22] Filed: Dec. 30, 1974
[21] Appl. No.: 537,433

[52] U.S. Cl. .............................. 330/28; 330/102; 330/103; 330/105; 330/106; 330/107; 330/109
[51] Int. Cl.² ........................................ H03F 1/34
[58] Field of Search ............. 330/28, 102, 103, 105, 330/106, 107, 109

[56] References Cited
UNITED STATES PATENTS
2,131,393  9/1938  Stillwell ..................... 330/102 X
2,541,322  2/1951  Barney ........................... 330/28
3,493,882  2/1970  Seader et al. ..................... 330/28
3,820,036  6/1974  Aiciyama .......................... 330/28

FOREIGN PATENTS OR APPLICATIONS
1,287,143  1/1969  Germany ........................ 330/28
1,272,998  7/1968  Germany ....................... 330/103

OTHER PUBLICATIONS
Chaplin et al., "Transistor Stage for Wideband Amplifiers" *Institution of Electrical Engineers — Proceedings*, vol. 106, Pt.B. Supplement No. 16, May 1959 pp. 762–772.

*Primary Examiner*—James B. Mullins
*Attorney, Agent, or Firm*—Joseph A. Cameron

[57] ABSTRACT
Current and voltage feedback are used in separate frequency dependent major loops around a high gain broadband amplifier to produce frequency shaped gain and matched input and output impedances.

4 Claims, 7 Drawing Figures 3,972,002

DUAL FEEDBACK AMPLIFIER

BACKGROUND OF THE INVENTION

This invention concerns the design of broadband feedback amplifiers, particularly such amplifiers having a frequency shaped gain characteristic.

The use of negative feedback, in which a portion of the output signal is combined out-of-phase with the input signal to reduce distortion generated in an amplifier, has been standard for many years. In the field of wire communications systems, however, transmission lines, be they open wire, twisted pairs of coaxial tubes, attenuate the transmitted signals as a function of the frequency content of the signals. As a result, in repeater amplifiers it is necessary to correct the distortion introduced by the transmission line as well as that generated within the amplifier. In addition, in a broadband communications network, where frequencies necessarily run into the VHF range, impedances must be matched between the amplifiers and the line to prevent signal reflections and standing waves.

Impedance matching may, of course, be accomplished by simply adding resistance in series with the line or in shunt with it. Such "brute force" methods, however, reduce the efficiency of the amplifier, and require more gain; furthermore, resistance added to the input greatly increases generated noise. Impedance matching is commonly accomplished through the use of a hybrid transformer coupling network in a feedback loop. In addition to introducing some signal loss and some noise degradation of the input, however, these networks tend to introduce considerable phase shift, particularly at high frequencies. This phase shift can produce stability problems in a high gain amplifier.

U.S. Pat. No. 2,541,322, which issued Feb. 13, 1951 to H. L. Barney, teaches the use of multiple feedback loops in an amplifier of one or more stages to provide simultaneously linear amplification and desired input and output impedances for matching purposes. Others have investigated and expanded on the solution of impedance matching in a broadband amplifier through the use of multiple loop feedback. See, for instance, U.S. Pat. No. 3,493,882, which issued to L. D. Seader et al., Feb. 3, 1970 and "Transistor Stage for Wideband Amplifiers" by G. B. B. Chaplin, C. J. N. Candy and A. J. Cole, *Institution of Electrical Engineers — Proceedings*, Vol. 106, Part B, Supplement No. 16, May 1959, page 762, et seq. Each of these disclosures, however, describes a special case in which the feedback networks are resistive and the amplifier characteristic is linear; any gain shaping would require additional line build-out networks.

An object of this invention is impedance matching together with frequency dependent gain shaping in a broadband amplifier without the need for either hybrid coupling networks in a feedback loop or line build-out networks.

Another object is impedance matching together with frequency dependent gain shaping through the use of dual major loop feedback.

Still another object is the use of passive frequency dependent feedback networks to provide predetermined gain shaping and impedance matching in a broadband amplifier.

SUMMARY OF THE INVENTION

The broadband amplifier circuit of the invention includes a high gain amplifier element with two frequency dependent major loop feedback circuits. One feedback signal is coupled in shunt with the input circuit; the other is coupled in series with the input circuit. The transfer functions of the feedback loops are chosen to generate predetermined amplifier input and output impedances for matching purposes, and a predetermined frequency dependent amplifier circuit gain characteristic.

I have found that the power gain of such an amplifier circuit is substantially equal to the magnitude of the reciprocal of the product of the transfer functions of the two feedback networks.

DETAILED DESCRIPTION

Figure 1:
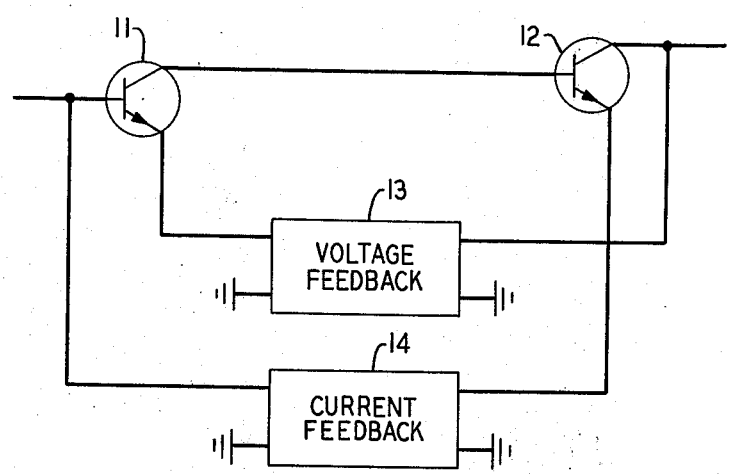
FIG. 1 is a partially schematic partially block diagram illustrating an embodiment of the invention employing a noninverting amplifier element.

FIG. 1 illustrates in partly block and partly schematic form, an embodiment of the invention employing a two-stage amplifier. Transistors 11 and 12, which form the amplifier stages, are each connected in common-emitter configuration. Two cascaded common-emitter stages are chosen to represent a general class of amplifiers which are noninverting; that is, in which the input signal and output signal are in phase. An amplifier element having any even number of common-emitter stages in tandem, or any other combination of stages which is noninverting, will operate as well in this embodiment. A first feedback network 13 is connected in a major loop from the collector output of transistor 12 to the emitter input of transistor 11. A major loop is defined as a loop that includes all of the amplifier stages and a coupling from an output of the last stage to an input of the first stage. A second feedback network 14 is connected in a major loop from the emitter output of transistor 12 to the base input of transistor 11. Both feedback networks may conveniently be of the three terminal two-port variety. Feedback network 13, being connected between output collector and input emitter, represents a voltage source dependent upon output voltage. Feedback network 14 connected between output emitter and input base represents a current source dependent upon output current.

Figure 2:
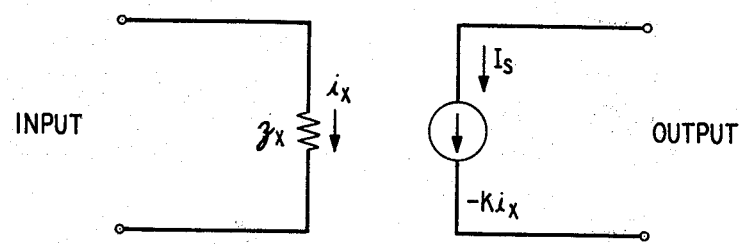
FIG. 2 is an equivalent circuit of a noninverting amplifier element useful in deriving design equations.

As an aid to understanding the process of designing feedback networks 13 and 14 to practice the invention, a few equations will be derived. An applicable equivalent circuit for analysis of a general class of amplifier which is noninverting, such as the two-stage amplifier element of FIG. 1 without the feedback networks, is shown in FIG. 2. In this figure, the amplifier input is represented by an impedance $z_x$ through which flows a current $i_x$. The output is represented by a current controlled current source $I_s$. $I_s$ is given by the product of the input current $i_x$ and the amplifier current gain, which is the frequency dependent variable $k$. Because of the direction chosen for $I_s$, the product is $-ki_x$.

Figure 3:
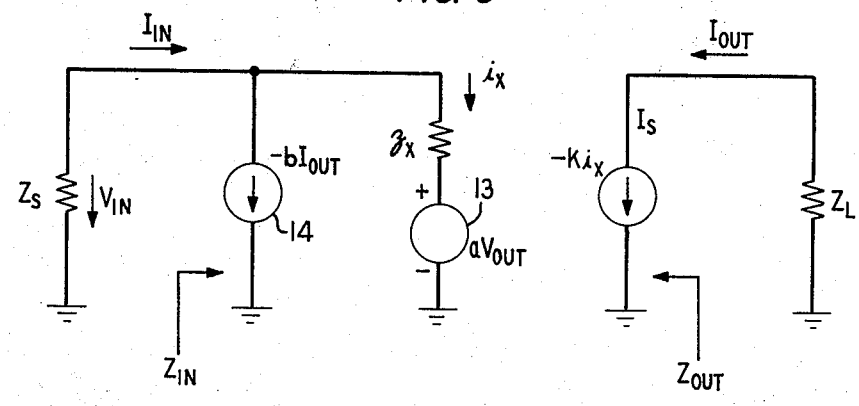
FIG. 3 is an equivalent circuit of the embodiment of FIG. 1 useful in deriving circuit design equations.

An equivalent circuit for the whole amplifier of FIG. 1, including the feedback networks, is shown in FIG. 3. In this figure, feedback network 13 is shown as a voltage source $aV_{out}$ connected in series with $z_x$, and feedback network 14 takes the form of a current source of value $-bI_{out}$ connected in shunt with impedance $z_x$. Input and output voltages, currents, and impedances, and source and load impedances are labeled in the conventional manner.

The input and output impedances for the equivalent circuit can be readily shown to be $$Z_{in} = \frac{z_x - akZ_L}{1 - bk} \qquad (1)$$

$$Z_{out} = \frac{Z_S + z_x - kZ_S b}{-ka} \qquad (2)$$

If the gain $k$ of the amplifier element is large, then the impedances may be approximated as $$Z_{in} = \frac{a}{b} Z_L \qquad (3)$$

$$Z_{out} = \frac{b}{a} Z_S \qquad (4)$$

A perfect impedance match requires that the amplifier input impedance $Z_{in}$ be the conjugate of the source impedance $Z_S$. That is, the two must have equal resistive components and reactive components which are of equal value and opposite sign. Using the symbol $Z_S$ for the conjugate of $Z_S^*$, therefore, for impedance match $$Z_{in} = Z_S^* = \frac{a}{b} Z_L, \qquad (5)$$

and similarly $$Z_{out} = Z_L^* = \frac{b}{a} Z_S. \qquad (6)$$

Solving each equation for $a/b$ yields:

$$\frac{Z_S^*}{Z_L} = \frac{a}{b} = \frac{Z_S}{Z_L^*} = \left(\frac{Z_S^*}{Z_L}\right)^* = \left(\frac{a}{b}\right)^*. \qquad (7)$$

The only way equation (7) can be true is if $a/b$, $Z_S^*/Z_L$ and $Z_S/Z_L^*$ are all real; $a, b, Z_S$ and $Z_L$, can, of course, be complex.

The power gain of the equivalent circuit of FIG. 3, with matched input and output impedances, may be expressed $$G = \frac{|I_{out}|^2 Re(Z_L)}{|I_{in}|^2 Re(Z_{in})} \qquad (8)$$

where $Re(Z)$ is the real part of $Z$.
Substituting $$-ki_x = I_{out}$$

and $$i_x - bI_{out} = I_{in} = i_x(1 + bk)$$

yields $$G = \frac{|k|^2 |i_x|^2 Re(Z_L)}{|i_x|^2 |1 + bk|^2 Re(Z_{in})}. \qquad (9)$$

For large values of $k$, this may be approximated by $$G = \frac{Re(Z_L)}{|b|^2 Re(Z_{in})}. \qquad (10)$$

From equation (7)

$$\frac{Z_S^*}{Z_L} = \frac{a}{b} = \frac{Z_S}{Z_L^*}$$

$$Z_S^* b = Z_L a \qquad (11)$$

and $$Z_S b = Z_L^* a. \qquad (12)$$

Adding equations (11) and (12) together yields:

$$(Z_S^* + Z_S)b = (Z_L^* + Z_L)a =$$

$$2Re(Z_S)b = 2Re(Z_L)a$$

$$\frac{Re(Z_L)}{Re(Z_S)} = \frac{b}{a}. \qquad (13)$$

Since, in a physically realizable system, $Re(Z_S)$ and $Re(Z_L)$ are both greater than zero and since $b/a$ is real, $$\frac{Re(Z_L)}{Re(Z_S)} = \frac{|b|}{|a|} = \frac{|b|}{|a|}$$

and $$G = \frac{Re(Z_L)}{|b|^2 Re(Z_{in})} = \frac{|b|}{|b|^2|a|} = \frac{1}{|ab|}. \qquad (14)$$

An amplifier can now be designed to practice the invention with the aid of equations (7) and (14). Equation (7), $Z_S^*/Z_L = a/b$ of course implies the constraint that the impedance ratio fraction $Z_S^*/Z_L$, which we will call $R$ for convenience, is real. In practice, of course, this is not a serious constraint since both $Z_S$ and $Z_L$ are usually designed to be real. The fraction $a/b$, therefore, is totally defined by the impedances we wish to match. Equation (14) can be solved for either $a$ or $b$ to yield:

$$a = \frac{1}{G\left|\frac{Z_L}{Z_S}\right|} = \frac{1}{\sqrt{G/R}} \qquad (15)$$

$$b = \frac{1}{\sqrt{G\left|\frac{Z_S}{Z_L}\right|}} = \frac{1}{\sqrt{GR}}. \qquad (16)$$

$a$, being the ratio of the voltage fed back to the input by network 13 to the output voltage, is the voltage transfer function of network 13; $b$, being the ratio of the current fed back to the input by network 14 to the output current, is the current transfer function of network 14.

Since the power gain $G$ is a function of frequency in order to provide the shaped gain which is the object of our amplifier design, this implies that both $a$ and $b$ will be functions of frequency. Once we have the expression for either $a$ or $b$, the other becomes simple to find through the relationship of equation (7).

Synthesis of the physical feedback network 13 from the transfer function $a$, may be accomplished through the use of standard methods taught by the texts on network synthesis. An example is the transfer function synthesis techniques material contained in *Synthesis of Passive Network*, by E. A. Guillemin (John Wiley & Sons, 1957).

Figure 4:
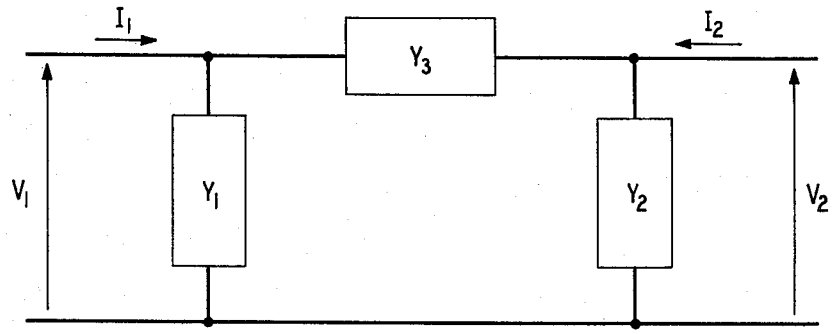
FIG. 4 is a block diagram of a passive network useful in synthesizing the feedback networks of the invention.

One practical approach to the network synthesis recognizes that three-terminal two-port networks made up entirely of passive elements can be represented by either a $\pi$ or T network. Consider therefore, the generalized $\pi$ network shown in FIG. 4. The general passive $\pi$ network is made up of a series admittance $Y_3$ with a shunt admittance $Y_1$ on one end, and a shunt admittance $Y_2$ on the other end. The voltage across admittance $Y_1$ is defined as $V_1$ and the voltage across admittance $Y_2$ is defined as $V_2$. The current entering the $Y_1$, $Y_3$ junction is defined as $I_1$ and the current entering the $Y_2$, $Y_3$ junction is defined as $I_2$. As is well known, the voltage transfer function $V_1/V_2$ taken when $I_1$ is equal to zero is given as $$h_{12} = \frac{V_1}{V_2}\bigg|_{I_1=0} = \frac{Y_3}{Y_3+Y_1} = a. \qquad (17)$$

Similarly, the current transfer function $-I_1/I_2$ taken when $V_1$ is equal to zero, is given by $$-g_{12} = -\frac{I_1}{I_2}\bigg|_{V_1=0} = \frac{Y_3}{Y_3+Y_2} = b. \qquad (18)$$

The negative sign is, of course, caused by the assumed direction of current $I_1$. Since $a$ is a voltage transfer ratio, and $b$ is a current transfer ratio, impedance scaling is possible in either network.

For the case where the input and output impedances are alike, that is, where $R$ is equal to 1, the feedback networks are equal, but with input and output interchanged so that one is the mirror image of the other. That is, $$a = h_{12} = \frac{Y_3}{Y_3+Y_1} = \frac{Y_3}{Y_3+Y_2} = b. \qquad (19)$$

Where the impedance ratio $R$ is less than 1, if the current feedback network 14 has been first synthesized in the $\pi$ form, the voltage feedback network can be readily derived using a mirror image of feedback network 14 with the addition of an admittance $Y_4$ in parallel with $Y_2$ and an admittance $Y_5$ in parallel with $Y_3$. The voltage transfer function $a$ then becomes $$a = h_{12} = \frac{Y_5+Y_3}{Y_5+Y_3+Y_4+Y_2}, \qquad (20)$$

but since $a$ is equal to $bR$, it can be readily seen that $Y_5$ is equal to $(R-1)Y_3$ and $Y_4$ is equal to $(1-R)Y_3$. Although $Y_5$ is negative, and therefore in general not passively realizable, the combination $Y_5 + Y_3$ is realizable as a single admittance element in the $\pi$ network.

Where the impedance ratio $R$ is greater than 1, the voltage feedback network 13 may be first synthesized in the $\pi$ form and the current feedback network derived therefrom. The derived network then becomes a mirror image of network 13 with an added admittance $Y_5 = Y_3[(1/R) - 1]$ shunting $Y_3$ and an added admittance $Y_4 = Y_3[1 - (1/R)]$ shunting $Y_1$. The combination of $Y_5$ and $Y_3$ is realizable as $Y_3/R$. It should be noted that in the case where $R$ is less than 1, $Y_1$ does not enter into the calculations and hence may be eliminated from the general $\pi$ network as an unnecessary load on the input. Similarly, in the case where $R$ is greater than 1, the admittance $Y_2$ may be eliminated.

Figure 5:
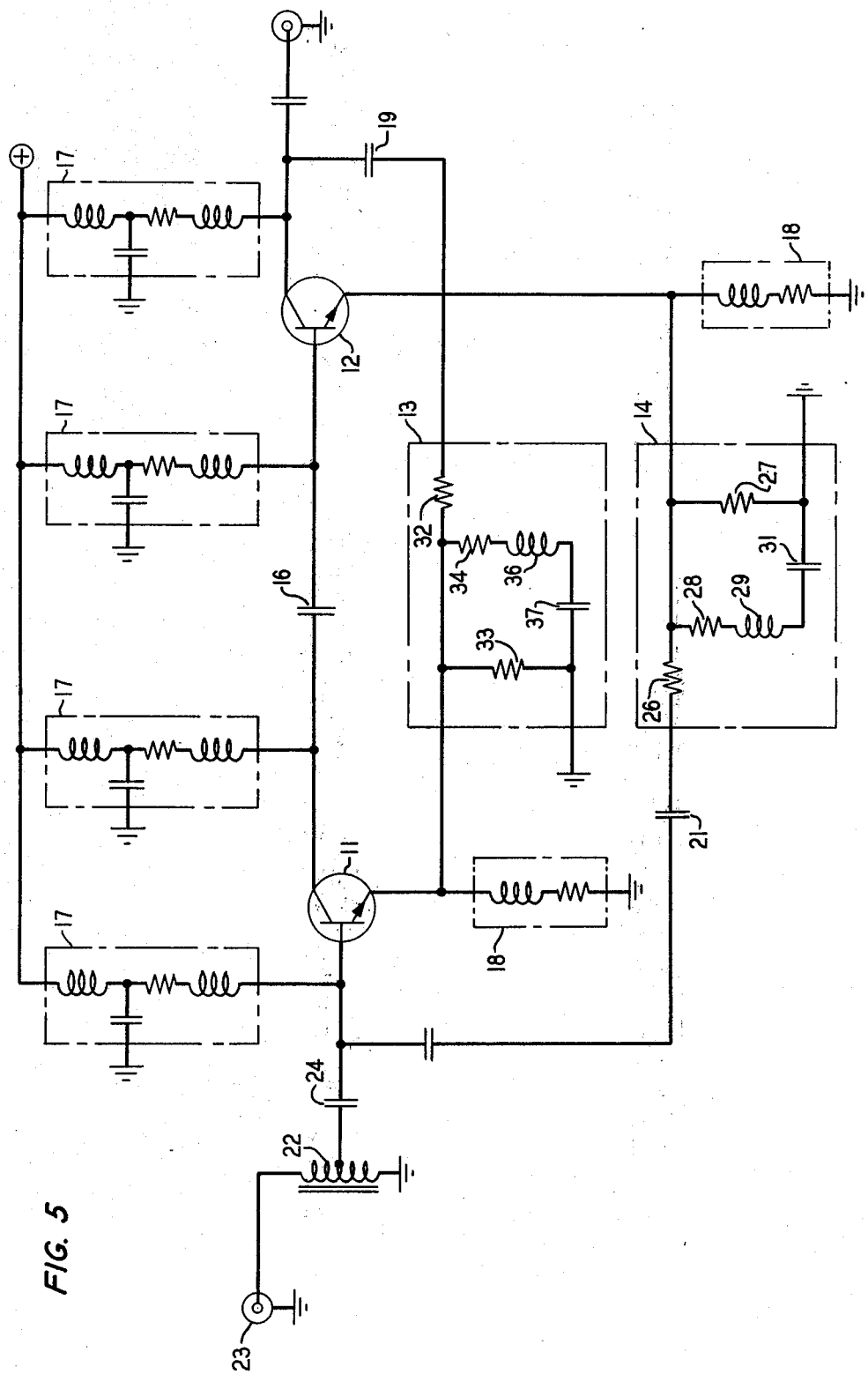
FIG. 5 is a schematic diagram of an amplifier designed according to the principles of the invention.

A particularly advantageous embodiment of the invention is shown in schematic form in FIG. 5. This circuit configuration can be used to produce impedance matching and a gain shape which compensates for the frequency attenuation suffered by transmission of a broadband signal through coaxial cable.

The circuit of FIG. 5 follows the block diagram of FIG. 1. The collector of first stage transistor 11 is connected through a coupling capacitor 16 to the base of second stage transistor 12. Following the practice of typical high frequency amplifier design, the base and collector electrodes of both transistors 11 and 12 are isolated from the power source by low-pass filters 17—17. The emitters are isolated from ground by low-pass filters 18—18. Voltage feedback network 13 is connected between the emitter of transistor 11 and the collector of transistor 12 through coupling capacitor 19, and current feedback network 14 is connected between the base of transistor 11 and the emitter of transistor 12 through a coupling capacitor 21. An autotransformer 22 is shown connected from the signal input terminal 23 to ground. The input signal is fed from the tap on autotransformer 22 through a coupling capacitor 24 to the base of transistor 11. Transformer 22 is not a necessary part of the invention, but it can be useful in reducing the input impedance seen by the amplifier in order to keep the noise figure very low. Although this use of the transformer does introduce a loss into the network, its contribution to the noise factor can more than offset that loss. Since this transformer is not in a feedback network, it does not affect the stability of the amplifier.

According to the principles of the invention, the values of the components of the feedback networks 13 and 14 are chosen to satisfy the design equations as previously discussed. In this case, the input and output impedances to be matched were each 50 ohms real, but transformer 22 allowed a matching input impedance of 12.5 ohms. The power gain to be produced by the amplifier of FIG. 5 is given as $G = 10^{[0.4\sqrt{f \times 10^{-6}}\,] - 2]}$.

Since $R$ is less than 1, network 14 was first synthesized. The series admittance $Y_3$ was realizable as a resistance 26, while the shunt admittance $Y_2$ was realized as the parallel combination of a resistance 27, and the series combination of a resistance 28, an inductance 29 and a capacitance 31. The voltage feedback network 13 derived from network 14 includes a series resistance 32 and a shunt admittance that includes the parallel combination of a resistance 33, and the series combination of a resistance 34, and inductance 36, and a capacitance 37.

Figure 6:
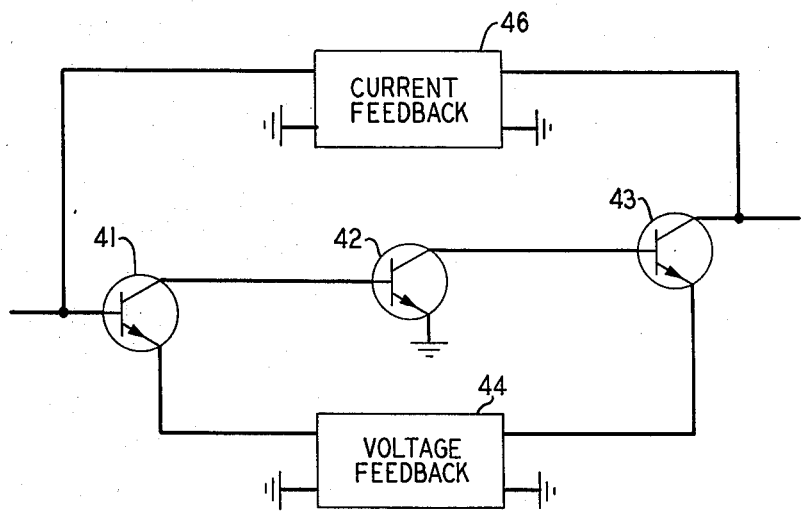
FIG. 6 is a partially block, partially schematic diagram illustrating an embodiment of the invention employing an inverting amplifier element.

The invention can also be practiced using an amplifier element which is inverting. Such an amplifier element may be made up, for instance, of a single common-emitter stage or an odd number of common-emitter stages cascaded together. An embodiment of the invention using an inverting amplifier element is shown in FIG. 6. In this figure, three transistors, 41, 42 and 43 are connected in cascade. That is, the collector of transistor 41 is connected to the base of transistor 42, and the collector of transistor 42 is connected to the base of transistor 43. A feedback network 44, which is a voltage source dependent upon output current, is connected between the emitter of output transistor 43 and the emitter of input transistor 41. Similarly, feedback network 46, which is a current source dependent upon output voltage, is connected between the collector of transistor 43 and the base of transistor 41.

It will be noted that the feedback networks in the case of the inverting amplifier element, FIG. 6, are connected opposite to those in the case of the noninverting amplifier element, FIG. 1. That is, the feedback signal derived from output voltage is connected in FIG. 6 as a current source in shunt with the input signal rather than as a voltage source in series with the input signal, as in FIG. 1. Similarly, the feedback signal derived from output current is connected in FIG. 6 as a voltage source in series with the input signal rather than as a current source in shunt with the input signal as in FIG. 1. Either circuit configuration could be used for either the inverting or the noninverting amplifier element case. The combinations shown herein, however, maintain the proper phasing for amplifier circuit stability with simple, passive feedback networks. The opposite combinations require a signal inversion within the feedback networks, and the use of transistors or transformers to accomplish the inversion can introduce phase shift and stability problems, particularly with amplifiers pushing the state of the art in bandwidth.

Figure 7:
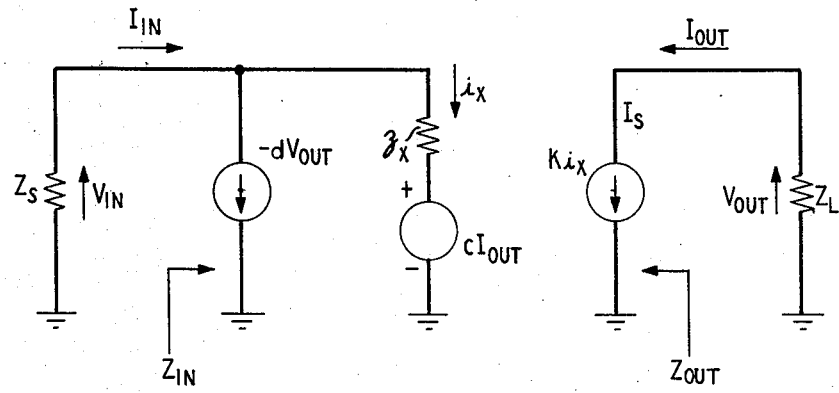
FIG. 7 is an equivalent circuit of the embodiment of FIG. 6 useful in deriving circuit design of equations.

As in the case of the circuits of FIG. 1 and FIG. 5, the feedback networks 44 and 46 may be three-terminal, two-port devices. With the help of the equivalent circuit of FIG. 7, the design equations for the feedback amplifier using an inverting amplifier element can be derived in a manner similar to that of the amplifier using a noninverting amplifier element previously described. In FIG. 7, as in FIG. 3, the input circuit of the amplifying element is represented by a resistance $z_x$, through which a current $i_x$ flows. The output circuit is represented by a current source $I_s$. In this case, the value of the current source is positive $ki_x$ because the amplifier element is inverting. A voltage source $cI_{out}$ is connected in series with $z_x$ and a current source $-dV_{out}$ is connected in shunt with $z_x$.

The input and output impedance for the equivalent circuit of FIG. 7, can be readily shown to be:

$$Z_{in} = \frac{z_x + kc}{1 + kdZ_L} \quad (21)$$

$$Z_{out} = \frac{z_x + Z_s + kc}{kdZ_s}. \quad (22)$$

For large values of amplifier gain $k$, $Z_{in}$ and $Z_{out}$ become $$Z_{in} = \frac{c}{dZ_L} \quad (23)$$

$$Z_{out} = \frac{c}{dZ_s}. \quad (24)$$

For the matched condition $Z_{in} = Z_S^*$ and $Z_{out} = Z_L^*$, equations (23) and (24) yield:

$$Z_S^* Z_L = Z_S Z_L^* = \frac{c}{d} = (c/d)^*. \quad (25)$$

The results are somewhat similar to those obtained with the noninverting amplifier element. The fraction $c/d$ and the products $Z_S^* Z_L$ and $Z_S Z_L^*$ must each be real, although $Z_S$, $Z_L$, $c$ and $d$ can each be complex.

As in the case of the noninverting amplifier element, the power gain here can be shown to be $$G = \frac{1}{|cd|}. \quad (26)$$

In this case, of course, $c$ is the ratio of the voltage fed back to the input by network 44 to output current, and hence may be defined as the transimpedance of network 44; $d$, being the ratio of the current fed back to the input by network 46 to the output voltage may be defined as the transadmittance of network 46. If we define $R'$ to be the ratio $c/d$ which here equals $Z_S Z_L$, then $$|c| = \frac{1}{\sqrt{G/R'}} \quad (27)$$

and $$|d| = \frac{1}{\sqrt{R'G}}. \quad (28)$$

Equations (25), (26), (27), and (28) are all that are needed to design an amplifier according to the principles of the invention, using an inverting amplifier element. Synthesizing techniques for the feedback networks will be similar to those for the noninverting case.

Broadband amplifiers can thus be designed to achieve both impedance matching and predetermined shaped gain according to the principles of this invention through the use of dual major loop feedback. The particular circuits and networks shown herein are, of course, only illustrative embodiments of the invention; the circuit designer will be able to use other amplifier element configurations, both inverting and noninverting, and other feedback network configurations without departing from the spirit and scope of the invention.

I claim:

1. A broadband amplifier circuit comprising:
   a high gain noninverting amplifier element having an input circuit path and an output circuit path,
   input means for coupling said input circuit path to a signal source having an impedance $Z_S$,
   output means for coupling said output circuit path to a load having an impedance $Z_L$,
   first frequency dependent feedback means having a voltage transfer function $a$ connected between said circuit paths for coupling in series with said input circuit path a voltage substantially equal to $a$ times the output voltage of said amplifier element,
   second frequency dependent feedback means having a current transfer function $b$ connected between said circuit paths for coupling in shunt with said input circuit path, a current substantially equal to $b$ times the current in said output circuit path,
   the parameters of said feedback means being chosen to satisfy the expressions $$G = \frac{1}{|ab|} \text{ and } \frac{a}{b} = \frac{Z_S^*}{Z_L} = \frac{Z_S}{Z_L^*}$$

in order to generate a desired frequency dependent amplifier circuit gain characteristic $G$, an amplifier circuit input impedance substantially equal to $Z_S^*$, the conjugate of said source impedance $Z_S$, and an amplifier circuit output impedance substantially equal to $Z_L^*$, the conjugate of said load impedance $Z_L$, $1/|ab|$ being the reciprocal of the magnitude of the product of said transfer functions.

2. A broadband amplifier circuit as in claim 1 wherein said first and second feedback means are each passive linear networks.

3. A broadband amplifier circuit as in claim 1 wherein said amplifying element comprises an even number of common-emitter transistor stages connected in tandem.

4. A broadband amplifier circuit as in claim 3 wherein said first feedback means is connected between the emitter of the last stage of said common-emitter stages and the base of the first stage of said common-emitter stages and said second feedback means is connected between the collector of the last stage of said common-emitter stages and the emitter of the first stage of said common-emitter stages.

* * * * *

UNITED STATES PATENT AND TRADEMARK OFFICE
CERTIFICATE OF CORRECTION

PATENT NO. : 3,972,002
DATED : July 27, 1976
INVENTOR(S) : Thomas J. Aprille, Jr.

It is certified that error appears in the above-identified patent and that said Letters Patent are hereby corrected as shown below:

Column 2, line 34, after "design" delete "of". Column 3, lines 38 and 39, an asterisk should be inserted over "S" (line 38) and deleted from "S" on line 39. Column 4, equations (15) and (16) should read $$|a| = \frac{1}{\sqrt{G\left|\frac{Z_L}{Z_S^*}\right|}} = \frac{1}{\sqrt{G/R}} \qquad (15)$$

$$|b| = \frac{1}{\sqrt{G\left|\frac{Z_S^*}{Z_L}\right|}} = \frac{1}{\sqrt{GR}} \quad , \qquad (16)$$

Column 6, line 53, the equation at the end of the line should read $$G = 10^{[(.4\sqrt{f \times 10^{-6}}) - 2]}$$

Column 8, line 24, add an asterisk over "S".

Signed and Sealed this

Twenty-third Day of November 1976

[SEAL]

Attest:

RUTH C. MASON
*Attesting Officer*

C. MARSHALL DANN
*Commissioner of Patents and Trademarks*